(12) United States Patent
Joo

(10) Patent No.: US 7,220,976 B2
(45) Date of Patent: May 22, 2007

(54) ION SOURCE AND ION IMPLANTER HAVING THE SAME

(75) Inventor: Young-Byeong Joo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 174 days.

(21) Appl. No.: 11/015,492

(22) Filed: Dec. 16, 2004

(65) Prior Publication Data
US 2005/0133738 A1 Jun. 23, 2005

(30) Foreign Application Priority Data
Dec. 19, 2003 (KR) ............... 10-2003-0093546

(51) Int. Cl.
*H01J 37/08* (2006.01)
*H01J 37/317* (2006.01)

(52) U.S. Cl. ............... 250/492.21; 250/423 R; 250/427; 315/111.81

(58) Field of Classification Search ................ None
See application file for complete search history.

(56) References Cited

U.S. PATENT DOCUMENTS

| 5,680,003 | A | | 10/1997 | Hartwick et al. | |
|---|---|---|---|---|---|
| 5,856,674 | A | * | 1/1999 | Kellerman | 250/423 F |
| 6,022,258 | A | | 2/2000 | Abbott et al. | |
| 6,184,532 | B1 | * | 2/2001 | Dudnikov et al. | 250/423 R |
| 6,204,508 | B1 | * | 3/2001 | Chen et al. | 250/423 R |
| 2002/0185607 | A1 | * | 12/2002 | Reyes | 250/426 |

FOREIGN PATENT DOCUMENTS

| KR | 950007921 | 6/1994 |
|---|---|---|
| KR | 980022041 | 7/1998 |

OTHER PUBLICATIONS

English language abstract of Korean Publication No. 980022041.
English language abstract of Korean Publication No. 950007921.

* cited by examiner

*Primary Examiner*—Nikita Wells
(74) *Attorney, Agent, or Firm*—Marger Johnson & McCollom, P.C.

(57) ABSTRACT

A filament includes a filament rod having an electron-emitting portion, a pair of leads, and a pair of connection portions. The electron-emitting portion is disposed in the arc chamber. The leads extend from the sidewall of the arc chamber to the outside of the arc chamber. The leads are connected to a filament power source. The connecting portions extend from the sidewall of the arc chamber to the inside of the arc chamber. The connection portions are connected between the electron-emitting portion and the leads. The connection portions have an electrical resistance less than that of the electron-emitting portion. Thus, electrons are thermoelectrically emitted into the arc chamber from the electron emission portion rather than the connection portions. An electron emission rate may also be increased. In addition, since the filament has a longer useful life, downtime of an ion implanter including the ion source may be decreased.

45 Claims, 11 Drawing Sheets

ION SOURCE AND ION IMPLANTER HAVING THE SAME

CROSS REFERENCE TO RELATED APPLICATION

This application claims priority under 35 USC § 119 to Korean Patent Application No. 2003-0093546, filed on Dec. 19, 2003, the content of which is herein incorporated by reference in its entirety for all purposes.

BACKGROUND OF THE INVENTION

1. Field of the Invention

The present invention relates to an ion source and to an ion implanter that includes the ion source. More particularly, the present invention relates to an ion source for generating ions (dopants) that are doped into a surface portion of a semiconductor substrate in processes for fabricating a semiconductor device, and an ion implanter that includes the aforementioned ion source.

2. Description of the Related Art

In general, a semiconductor device is manufactured by a fabrication process for forming an electrical circuit on a silicon wafer that is used for a semiconductor substrate, an electrical die sorting (EDS) process for testing electrical characteristics of the electric circuit, and a package process for enclosing the substrate with an epoxy resin and then separating the substrate into individual single chips.

The fabrication process includes a deposition process for forming a layer on the wafer, a chemical mechanical polishing process for planarizing a surface of the layer, a photolithography process for forming a photoresist pattern on the layer, an etching process for forming a pattern having electrical characteristics using the photoresist pattern as an etching mask, an implantation process for implanting ions into predetermined regions of the wafer, a cleaning process for removing particles from the surface of the wafer, a drying process for drying the wafer after the cleaning process, and a testing process for detecting defects on the layer or the pattern of the clean, dry processed wafer.

The implanting process is preformed to be doped in a predetermined region of the semiconductor substrate with ions by implanting these ions into the predetermined region of the semiconductor substrate. An ion implanter for performing the implanting function includes an ion source for generating the ions. Examples of this ion source are disclosed in U.S. Pat. No. 6,022,258 (issued to Abbott et al.), U.S. Pat. No. 6,184,532 (issued to Dudnikov et al.), and U.S. Laid Open Publication No. 2002-0185607.

The ion source includes an arc chamber for generating the ions therein and a filament for thermoelectrically emitting electrons into the arc chamber. A filament current is applied to the filament so that the filament emits the electrons. An arc voltage biased with respect to the filament current is applied to the arch chamber. That is, the filament is used as a cathode and the arc chamber is used as an anode.

The filament is electrically insulated from the arc chamber with an insulating member. The electrons are thermoelectrically emitted from the filament by applying a filament current to the filament. The emitted electrons collide with molecules in a source gas so that the ions are generated.

During emitting the electrons, the filament may be deteriorated due to thermal stress caused by high temperature. This deterioration is generated at a central portion of the filament from which the electrons are mainly emitted and at a portion of the filament adjacent to the arc chamber. The deterioration of the filament decreases the emission rate of the ion source. If the deteriorated filament is broken, the amount of down time of the ion source and the ion implanter may be increased.

SUMMARY OF THE INVENTION

The present invention provides an ion source including a filament that has long endurance by suppressing deterioration of the filament by thermal stress.

The present invention also provides an ion implanter including the above-mentioned ion source.

In accordance with one aspect of the present invention, an ion implanter includes an ion source having an arc chamber and a filament for providing electrons into the arc chamber, an end station unit for handling a semiconductor substrate to implant ions provided from the ion source into a surface portion of the semiconductor substrate, and transportation unit connected between the ion source and the end station unit for transferring the ions to the end station unit.

A source gas including materials that are implanted into the surface portion of the semiconductor substrate is introduced into the arc chamber. The source gas collides with the electrons emitted from the filaments to generate the ions.

According to one embodiment of the present invention, the filament includes a filament rod extending from inside of the arc chamber to outside of the arc chamber through a sidewall of the arc chamber. The filament rod includes an electron-emitting portion, a pair of leads, and a pair of connection portions. The electron-emitting portion is disposed in the arc chamber. The leads may extend from the sidewall of the arc chamber to the outside of the arc chamber. The leads may be connected to a filament power source. The connecting portions extend from the sidewall of the arc chamber to the inside of the arc chamber. The connection portions are connected between the electron-emitting portion and the leads. The connection portions have an electrical resistance less than that of the electron-emitting portion. The electron-emitting portion corresponds to a central portion of the filament rod. The connection portions correspond to side portions of the filament rod, which are adjacent to the sidewall of the arc chamber.

A first coil for suppressing deterioration of the electron-emitting portion due to thermal stresses is wound around the electron-emitting portion. A pair of second coils for reducing electrical resistances of the connection portions is wound around the connection portions. The second coil has a diameter greater than the first coil. Preferably, the filament rod and the first second coils may include tungsten or tantalum.

The electrons are mainly emitted from the electron-emitting portion rather than the connection portions due to the resistance difference between the electron-emitting portion and the connection portions. As a result, the filament may have long endurance so that downtime of the ion implanter may be decreased.

According to another embodiment of the present invention, a filament includes an ion-emitting portion, a pair of leads, and a pair of connection portions. The ion-emitting portion for emitting electrons into an arc chamber is disposed in the arc chamber. The leads extend from a sidewall of the arc chamber to outside of the arc chamber. The leads are connected to a filament power source. The connection portions extend into the arc chamber through the sidewall. The connection portions are connected between the electron-emitting portion and the leads. The connection portions have irregular outer surfaces that have a mean diameter longer than that of the electron-emitting portion. Thus, the connection portions have electrical resistances less than that of the electron-emitting portion.

The irregular outer surfaces may be formed by coils wound around the connection portions or by rings enclosing the connection portions. Alternatively, the irregular outer surfaces may be formed by threads or annular projected portions formed at a surface portion of the connection portions.

According to still another embodiment of the present invention, a filament includes an electron-emitting portion, a pair of leads, and a pair of connection portions. The electron-emitting portion for emitting electrons into an arc chamber is disposed in the arc chamber. The electron-emitting portion has an irregular outer surface for increasing an active area from which the electrons are emitted. The leads extend from a sidewall of the arc chamber to outside of the arc chamber. The leads are connected to a filament power source. The connection portions extend into the arc chamber through the sidewall. The connection portions are connected between the electron-emitting portion and the leads. The connection portions have electrical resistances less than that of the electron-emitting portion.

According to still another embodiment of the present invention, a filament includes an electron-emitting portion, a pair of leads, and a pair of connection portions. The electron-emitting portion for emitting electrons into an arc chamber is disposed in the arc chamber. The electron-emitting portion has a first irregular outer surface for increasing an active area from which the electrons are emitted. The leads extend from a sidewall of the arc chamber to outside of the arc chamber. The leads are connected to a filament power source. The connection portions extend into the arc chamber through the sidewall. The connection portions are connected between the electron-emitting portion and the leads. The connection portions have a second irregular outer surface that has a mean diameter greater than that of the electron-emitting portion. Thus, the connection portions have electrical resistances less than that of the electron-emitting portion.

The first irregular outer surface electron-emitting portion may be formed by a first coil wound around the electron-emitting portion. The second irregular outer surface may be formed by a second coil enclosing the connection portions. Preferably, a diameter of the first coil is less than that of the second coil.

According to still another embodiment of the present invention, a filament includes an electron-emitting portion, a pair of leads, a pair of connection portions, a first coil and a pair of second coils. The electron-emitting portion for emitting electrons into an arc chamber is disposed in the arc chamber. The connection portions extend into the arc chamber through the sidewall. The connection portions are connected between the electron-emitting portion and the leads. The first coil is wound around the electron-emitting portion. The first coil suppresses deterioration of the electron-emitting portion by thermal stress. The second coils are wound around the connection portions. The second coils reduce electrical resistances of the connection portions relatively compared to that of the electron-emitting portion. The second coils also have a diameter greater than the first coil.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE PREFERRED EMBODIMENTS

The present invention now will be described more fully hereinafter with reference to the accompanying drawings in which embodiments of the invention are shown.

Figure 1:
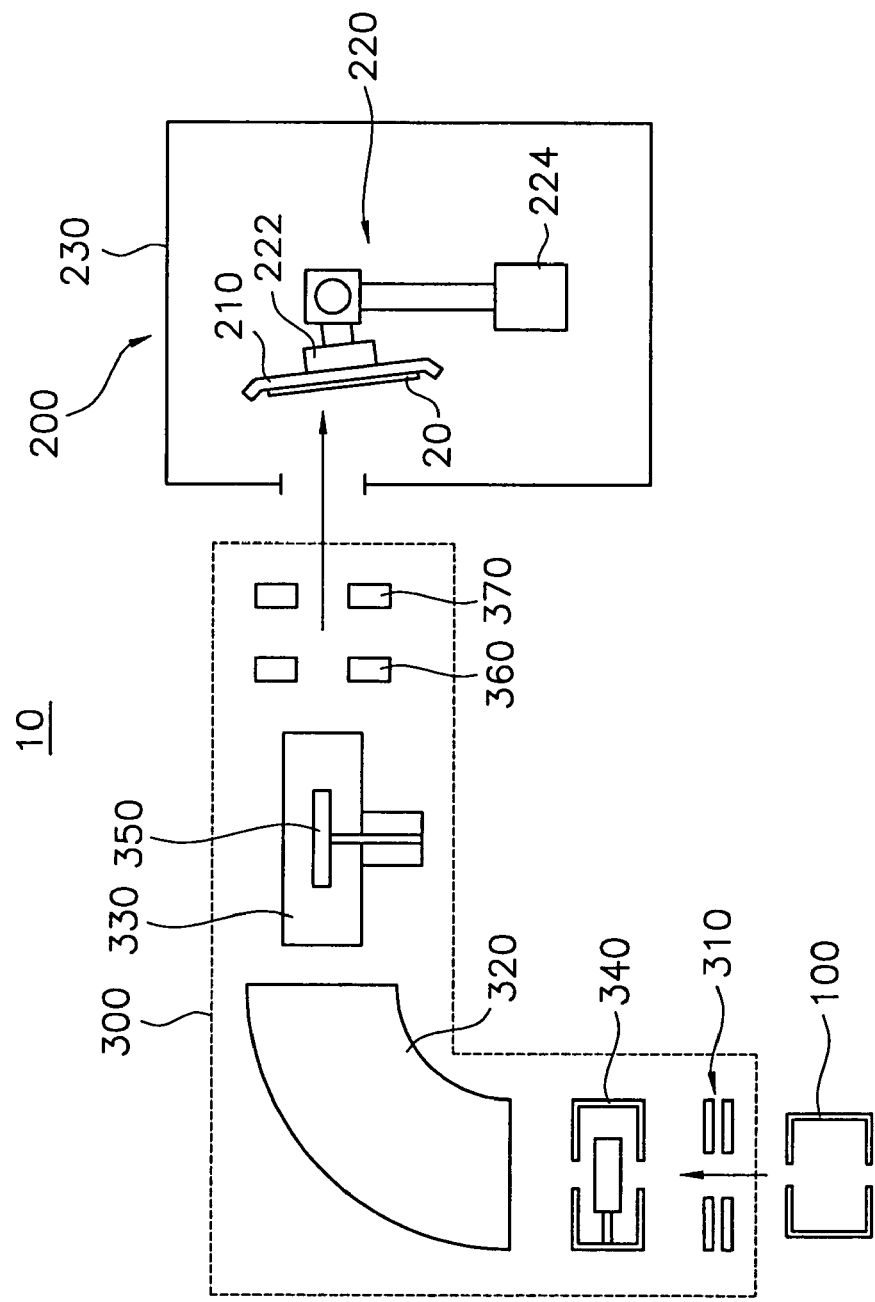
FIG. 1 is a plan view illustrating an ion implanter in accordance with one embodiment of the present invention.

Referring to FIG. 1, an ion implanter 10 includes an ion source 100 for generating ions that are subsequently implanted into a surface portion of a semiconductor substrate 20, an end station unit 200 for handling a semiconductor substrate 20 for implanting the ions generated from the ion source 100 into the surface portion of the semiconductor substrate 20, and a transportation unit 300, connected between the ion source 100 and the end station unit 200, for transferring the ions to the end station unit 200.

The ion source 100 includes an arc chamber (not shown) for providing a space in which the ions are generated and at least one filament (not shown) for emitting electrons into the arc chamber. A source gas, including a material that is implanted into the surface portion of the semiconductor substrate 20, is introduced into the arc chamber through a source gas-supplying pipe (not shown). Molecules of the source gas collide with the electrons emitted from the filaments so that the ions are generated. The ions are then implanted into the surface portion of the semiconductor substrate 20 disposed in the end station unit 200.

The end station unit 200 includes a chuck 210 for supporting the semiconductor substrate 20 and a driving unit 220 connected to the chuck 210. The chuck 210 and the drive unit 220 are disposed in an ion-implanting chamber 230. The driving unit 220 tilts the chuck 210 to adjust the incident angle of an ion beam with respect to the semiconductor substrate 20 supported by the chuck 210. The driving unit 220 also moves the chuck 210 in a vertical direction so that the ion beam scans the semiconductor substrate 20 supported by the chuck 210.

The chuck 210 secures the semiconductor substrate 20 using an electrostatic force thereon. The driving unit 220 includes a first driving portion 222 for tilting the chuck 220 and a second driving portion 222 for moving the chuck 210 in a vertical direction. While the ions are implanted into the surface portion of the semiconductor substrate 20, the second driving portion 224 adjusts the angle of tilt of the semiconductor substrate 20 for suppressing the channeling effect caused in channels between rows of silicon atoms of the crystalline structure of the semiconductor substrate 20. For example, if the ion beam is irradiated in a horizontal direction, the first driving portion 222 tilts the chuck 210 until the semiconductor substrate 20 has the tilted angle of about 7° with respect to a vertical line. Thus, the ion beam irradiated on the surface portion of the semiconductor substrate 20 has an incident angle of about 83°.

Although it is not shown in the drawings, the end station unit 200 may further include a third driving portion (not shown) for periodically rotating the semiconductor substrate 20 during performing an Ion Implantation process to reduce shadow effects caused by patterns formed at the surface portion of the semiconductor substrate 20. The end station unit 200 may further include a transportation robot (not shown) for loading or unloading of the semiconductor substrate 20.

In the present embodiment, although the end station unit 200 is schematically illustrated, the scope of the present invention is not restricted by elements of the end station unit, which are depicted. For example, a batch type chuck on which wafers are disposed, as well as a single type chuck illustrated in the present embodiment, may be employed in the end station unit.

The transportation unit 300 includes an ion extractor 310 for extracting the ions generated from the ion source 100, a mass spectrometer 320 for selecting ions that are subsequently implanted into the surface portion of the semiconductor substrate 20 from among the ions extracted by the extractor 310, and an accelerator 330 for accelerating the ions selected by the mass spectrometer 320.

An extraction voltage is applied to the ion extractor 310 to extract the ions from the arc chamber. The extracted ions are converted into ion beams including the ions.

A first converter 340 is disposed between the ion extractor 310 and the mass spectrometer 320. The first converter 340 converts the polarity of the ion beam formed by the ion extractor 310. The first converter 340 includes solid magnesium, which serves as an electron donor, and a heater. The heater heats the solid magnesium to a temperature of about 450° C. to generate gaseous magnesium molecules. The gaseous magnesium molecules collide with the ion beams to generate electrons. The ion beams interact with the electrons so that the ion beams are then converted into negative ion beams. The mass spectrometer 320 selects ions in the negative ion beams.

The accelerator 330 accelerates the ions in the selected ion beam to achieve various energy levels. A second polarity converter 350 for converting the polarity of the ion beam that passes through the accelerator 330 is connected to the accelerator 330. The second polarity converter 350 converts the polarity of the ion beam using a stripping gas. Thus, the second polarity converter 350 includes a gas stripper.

The accelerator 330 includes a first acceleration portion for accelerating the negative ion beam, and a second acceleration portion for accelerating a positive ion beam that is converted from the negative ion beam by the second polarity converter 350. The second polarity converter 350 is located between the first acceleration portion and the second acceleration portion. The negative ion beam accelerated by the first acceleration portion is then converted into the positive ion beam by the stripping gas provided from the second polarity converter 350. The second acceleration portion accelerates the converted positive ion beam. The stripping gas may include an inert gas such as a nitrogen gas or argon gas. Negative ions in the negative ion beam collide with the stripping gas and are converted into positive ions.

The transportation unit 300 includes an ion filter 360 for selecting ions having a predetermined energy level, and a focusing lens for focusing the ion beam on the surface portion of the semiconductor substrate 20.

Although it is not shown in the drawings, the transportation unit 300 may further include a scanning electrode for adjusting directions of the ion beam to scan the semiconductor substrate 20 with the ion beam, and a deflection electrode for deflecting the ion beam to remove particles generated from collisions between the ion beam and residual gases. Also, the transportation unit 300 may include an ionic current-measuring apparatus for measuring an ion current of the ion beam. The ionic current-measuring apparatus may include a first Faraday system disposed between the mass spectrometer 320 and the accelerator 330 for measuring the ionic current of the negative ions, and a second Faraday system disposed between the accelerator 330 and the ion implant chamber 230 for measuring the ionic current of the positive ions.

Figure 2:
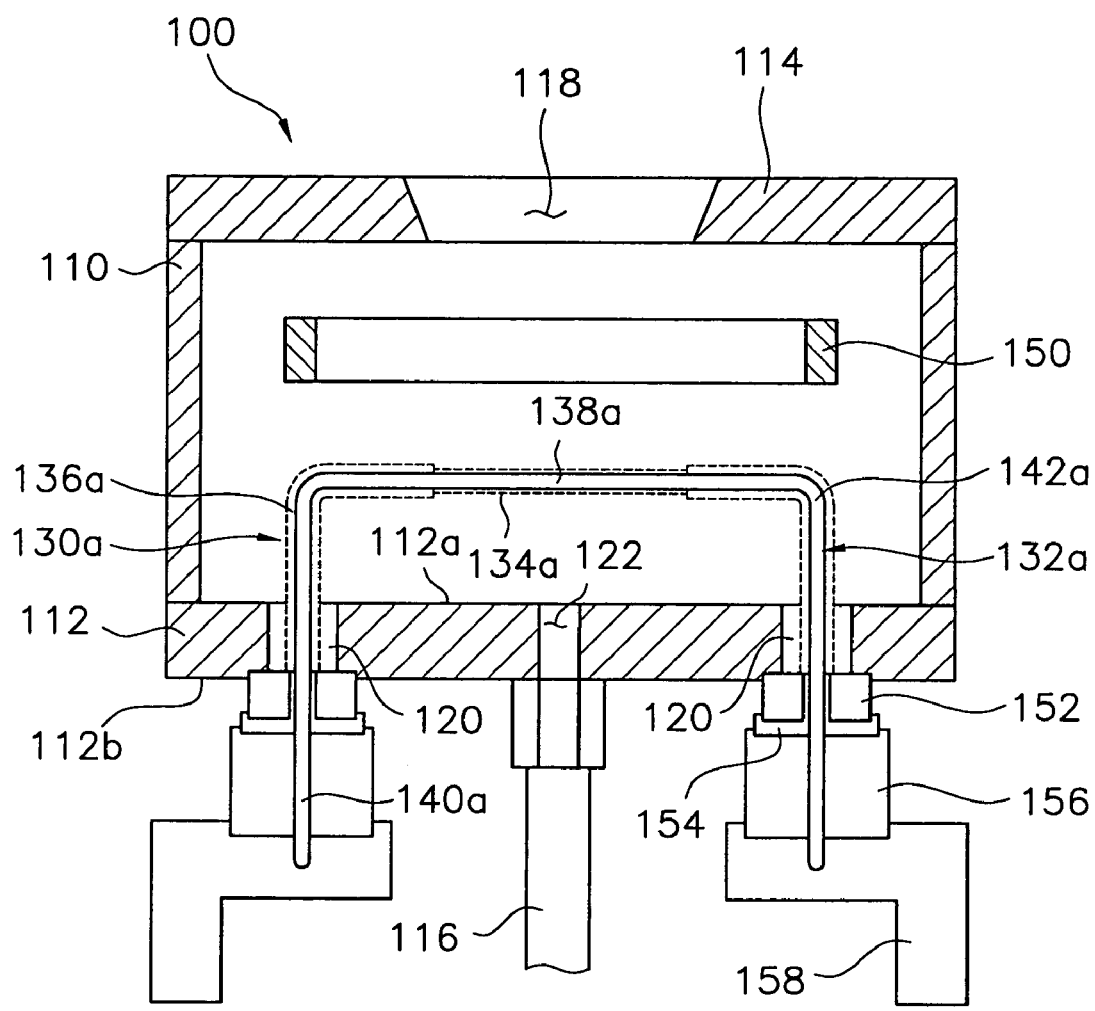
FIG. 2 is a cross sectional view illustrating an ion source in FIG. 1.
Figure 3:
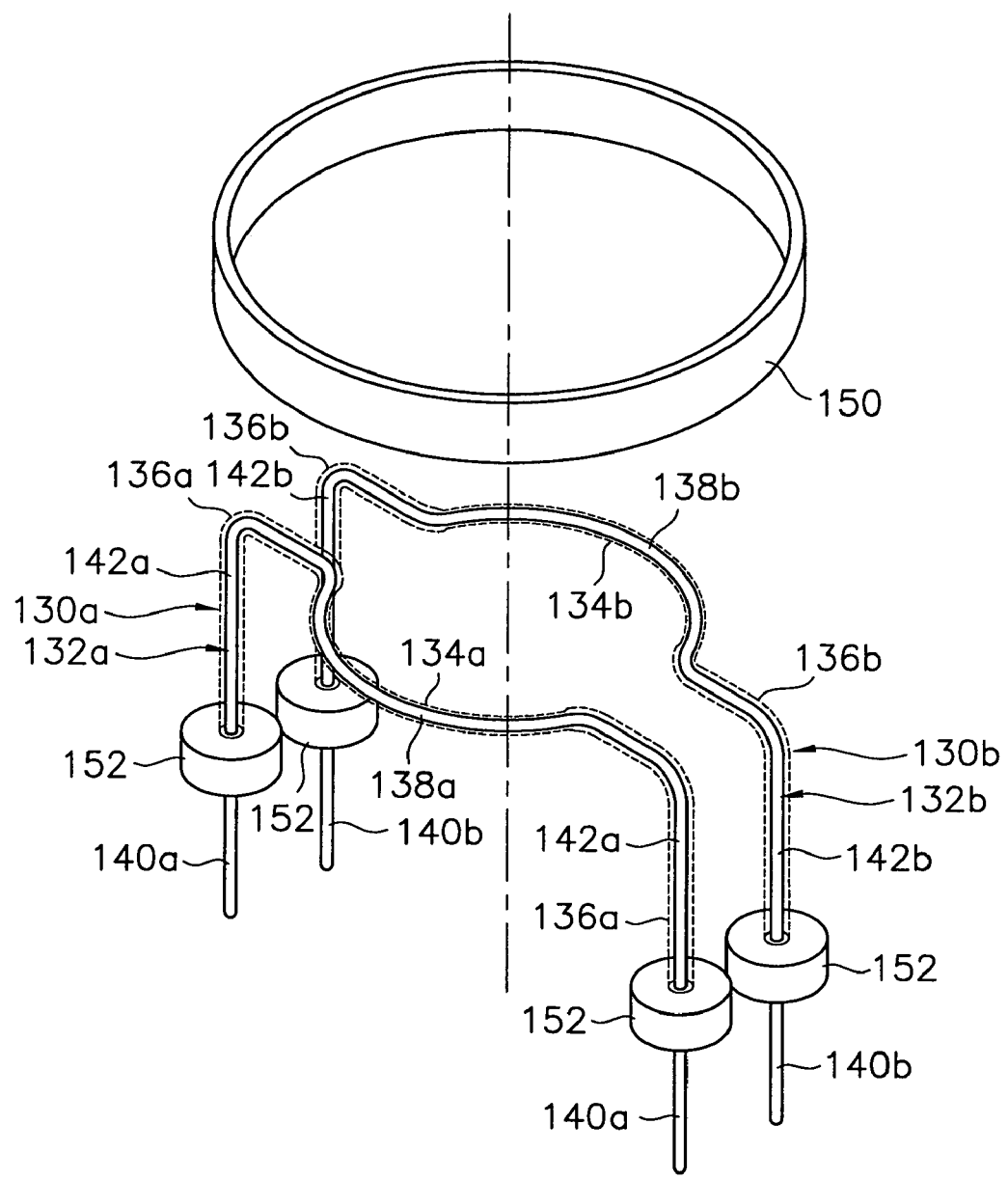
FIG. 3 is a perspective view illustrating a first filament rod of a first filament and a second filament rod of a second filament in FIG. 2.
Figure 4:
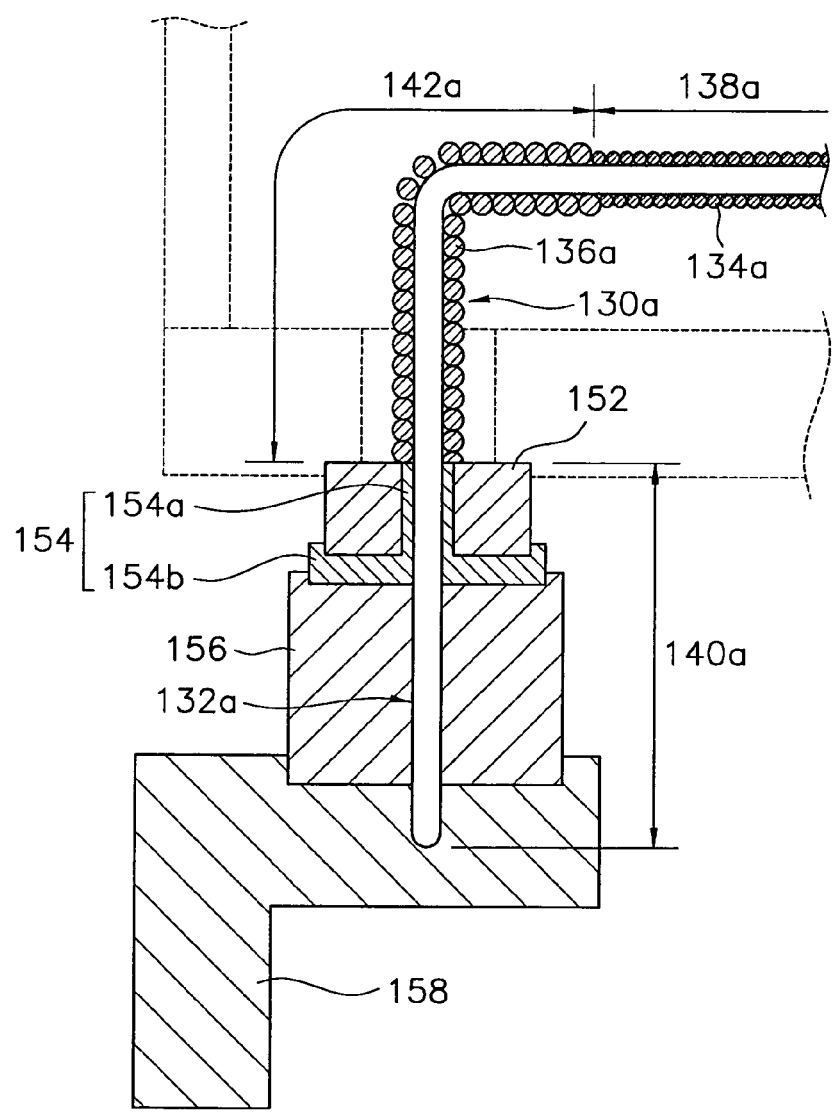
FIG. 4 is an enlarged cross sectional view illustrating the first filament in FIG. 2.

Referring to FIGS. 2 to 4, the ion source 100 includes an arc chamber 110 for providing a space, in which a source gas is ionized, and a first filament 130a and a second filament 130b for emitting electrons into the arc chamber 110.

The arc chamber 110 has a cylindrical shape defined by first and second walls 112 and 114. A source gas supply pipe 116 for supplying the source gas is connected to the first wall 112. An extraction hole 118 for extracting ions from the arc chamber 110 is formed through the second wall 114.

The first filament 130a includes a first filament rod 132a having a constant diameter that extends from inside of the arc chamber 110 to outside of the arc chamber 110 through the first wall 112, a first coil 134a wound around a central portion of the first filament rod 132a at uniform intervals, and a pair of second coils 136a wound around both side portions of the first filament rod 132a, which are adjacent to an inner face 112a of the first wall 112.

A plurality of holes 120, through which the first and second filaments 130a and 130b pass, is formed through the first wall 112 of the arc chamber 110. The first filament rod 132a includes an electron-emitting portion 138a disposed in the arc chamber 110, a pair of leads 140a extending from an outer face of the first wall 112 of the arc chamber 110 to outside of the arc chamber 110, and a pair of connection portions 142a extending from the outer face of the first wall 112 of the arc chamber 110 to the inside of the arc chamber 110 and connected between the electron-emitting portion 138a and the leads 140, respectively.

The electron-emitting portion 138a has an arch shape. The electron-emitting portion 138a is disposed in parallel with the first wall 112. The pair of leads 140a extends to the outside of the arc chamber in a direction substantially perpendicular to the first wall 112. The connection portions 142a extend to the inside of the arc chamber 110 through the first wall 112. The connection portions 142a also extend toward the electron-emitting portion 138a from a position spaced apart from the first wall 112.

A first coil 134a is uniformly wound around the electron-emitting portion 138a. The first coil 134a suppresses deterioration of the electron-emitting portion 138a by thermal stress. Further, the first coil 134a increases the active surface area of the electron-emitting portion 138a to improve the electron emission rate.

Second coils 136a are uniformly wound around the connection portions 142a. The second coils 136a lower electrical resistances of the connection portions 142a to be less than that of the electron-emitting portion 138a. The second coils 136a have a diameter greater than the first wire 134a. The first coil 134a and the second coils 136a may be formed of substantially the same material. The inner diameter of the first coil 134a may be substantially equal to that of the second coils 136a. The outer diameter of the first coil 134a may be shorter than that of the second coils 136a. Furthermore, the mean diameter of the second coils 136a may be greater than that of the first coil 134a. As a result, electrical resistances of the connection portions 142a may be less than that of the electron-emitting portion 138a. Consequently, the electrons may be thermoelectrically emitted into the arc chamber 110 from the electron-emitting portion 138a rather than the connection portions 142a.

Preferably, the first filament rod 132a, and/or the first coil 134a and/or the second coils 136a may include tungsten or tantalum. In one embodiment of the present invention, the first filament rods 132a and the second filament rod 132b may include tungsten, and the first coil 134a and the second coils 136a may include tantalum. If, for example, a filament current of about 200 angstroms and a filament voltage of about 10 V are applied to the first filament 130a, the diameters of the filament rod 132a, the first coil 134a, and the second coils 136a may preferably be from about 1.9 mm to about 2.1 mm, from about 0.3 mm to about 0.35 mm, and from about 0.7 mm to about 0.8 mm, respectively. The diameters of the filament rod 132a, the first coil 134a, and the second coils 136a may vary according to a filament power applied to the first filament 130a.

Elements of the second filament 130b as depicted are substantially identical to those of the first filament 130a. The second filament 130b is disposed adjacent to the first filament 130a. The second filament 130b may include a second filament rod 132b, a third coil 134b wound around an electron-emitting portion 138b of the second filament rod 132b, and fourth coils 136b wound around connection portions 142b of the second filament rod 132b.

The electron-emitting portions 138a and 138b are disposed in a circular area defined by the arc chamber 110. The source gas is provided from the source gas supply pipe 116, which extends toward the center of the circular area. The source gas-supplying hole 122, which is in communication with the source gas supply pipe 116, is generally disposed within the central axis of the circular area. The central axis of the circular area extends in a direction substantially perpendicular to the first wall 112.

Electrons, which are thermoelectrically emitted from the electron-emitting portions 138a and 138b, collide with molecules of the source gas that is provided from the source gas supply pipe 116. In this way, ions are generated. The ions are extracted from the arc chamber 110 by an ion extractor 310. The electrons emitted from the electron-emitting portions 138a and 138b and electrons generated during generating the ions are removed from the arc chamber 110 by an anode ring 150. The anode ring 150 is disposed above the first wall 112. The electron-emitting portions 138a and 138b are disposed between the first wall 112 and the anode ring 150. The center of the anode ring 150 is disposed along the central axis of the circular area. An arc voltage for collecting the electrons is applied to the anode ring 150.

The holes 120 formed through the first wall 112 have diameters greater than outer diameters of the first and second filament rods 132a and 132b. The first and second filament rods 132a and 132b, which pass through the holes 120, are electrically insulated from the arc chamber 110.

A plurality of the insulation rings 152 in communication with the holes 120 are disposed on the outer surface of the first wall 112. The insulation rings 152 are disposed coaxially with the holes 120, respectively. The insulation rings 152 surround the leads 140a and 140b of the first and second filament rods 132a and 132b, respectively. The insulation rings 152 have outer diameters greater than inner diameters of the holes 120, respectively. The leads 140a and 140b extend along the central axes of the insulation rings 152, respectively. Accordingly, the first and second filament rods 132a and 132b are electrically insulated from the arc chamber 110 by the insulation rings 152 and the walls 112 that define the holes 120.

Clamps 158 connected to a filament power source lock the first and second filaments 130a and 130b in place. The clamps 158 are lockingly secured the leads 140a and 140b using locking members (for example, a bolt and a nut).

Spacers 156 are interposed between the insulation rings 152 and the clamps 158, respectively. Sleeves 154 are interposed between the spacers 156 and the insulation rings 152, respectively. The sleeves 154 include upper and lower cylinder portions 154a and 154b. The upper cylinder portion 154a is inserted into the insulation rings 152, and the lower cylinder portion 154b is disposed on a side face of the insulation ring 152.

Holes having inner diameters substantially equal to outer diameters of the upper cylinder portions 154a are formed within the insulation rings 152. The leads 140a and 140b passing through insulation rings 152, the sleeves 154, and the spacers 156 are locked by the clamps 158. The sleeves 154 and the spacers 156 may include a conductive material. Thus, electrical resistances of the leads 140a and 140b may be greater than those of the connection portions 142a and 142b.

Although it is not specifically illustrated in the drawings, permanent magnets for forming magnet fields may be disposed adjacent to the arc chamber 110 to adjust movements of electrons emitted from the electron-emitting portions 138a and 138b. The permanent magnets prevent the electrons from being directly collected by the anode ring 150.

In this embodiment of the present invention, although the ion source 100 includes a pair of filaments 130a and 130b for emitting the electrons, the ion source 100 may include a single filament for emitting the electrons.

Figure 5:
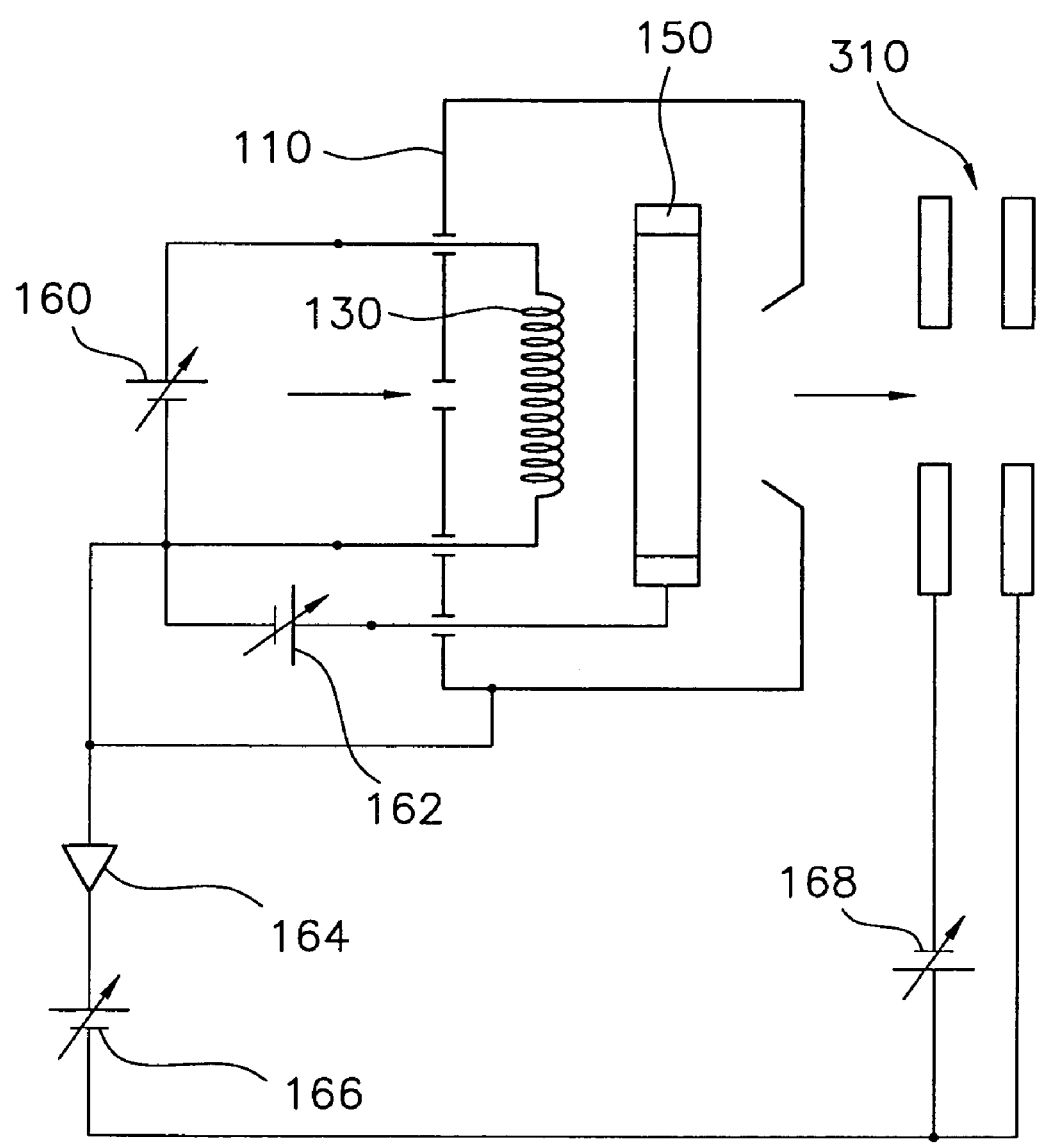
FIG. 5 is an electrical circuit diagram illustrating a circuit connected to the ion source in FIG. 2.

Referring to FIG. 5, a filament current is applied to filament 130 and electrons are thereby thermoelectrically emitted into the arc chamber 110. An arc voltage biased with respect to the filament current is applied to the anode ring 150 disposed in the arc chamber 110. Leads of the filament 130 are connected to anode and cathode terminals of a filament power source 160, respectively. The anode ring 150 is connected to an anode terminal of the arc power source 162. A cathode terminal of the arc power source 162 is connected to the cathode terminal of the filament power source 160. The anode terminals of the filament power source 160 and the arc power source 162 are connected to a wall of the arc chamber 110. The cathode terminals of the filament power source 160 and the arc power source 162 are connected to a source ground 164.

The ion extractor 310 is connected a cathode terminal of an extraction power source 166. A suppression power source 168 is connected between the ion extractor 310 and the extraction power source 166.

The filament current heats the filament 130 up to a thermionic temperature (for example about 2500° C.) to emit the electrons from the filament 130 into the arc chamber 110 at the thermionic temperature.

The electrons emitted into the arc chamber 110 collide with the molecules of the source gas so that source gas ions are generated. The ions are extracted from the arc chamber 110 by the ion extractor to which the extraction voltage is applied. The electrons are removed from the arc chamber 110 by the anode ring 150.

Figure 6:
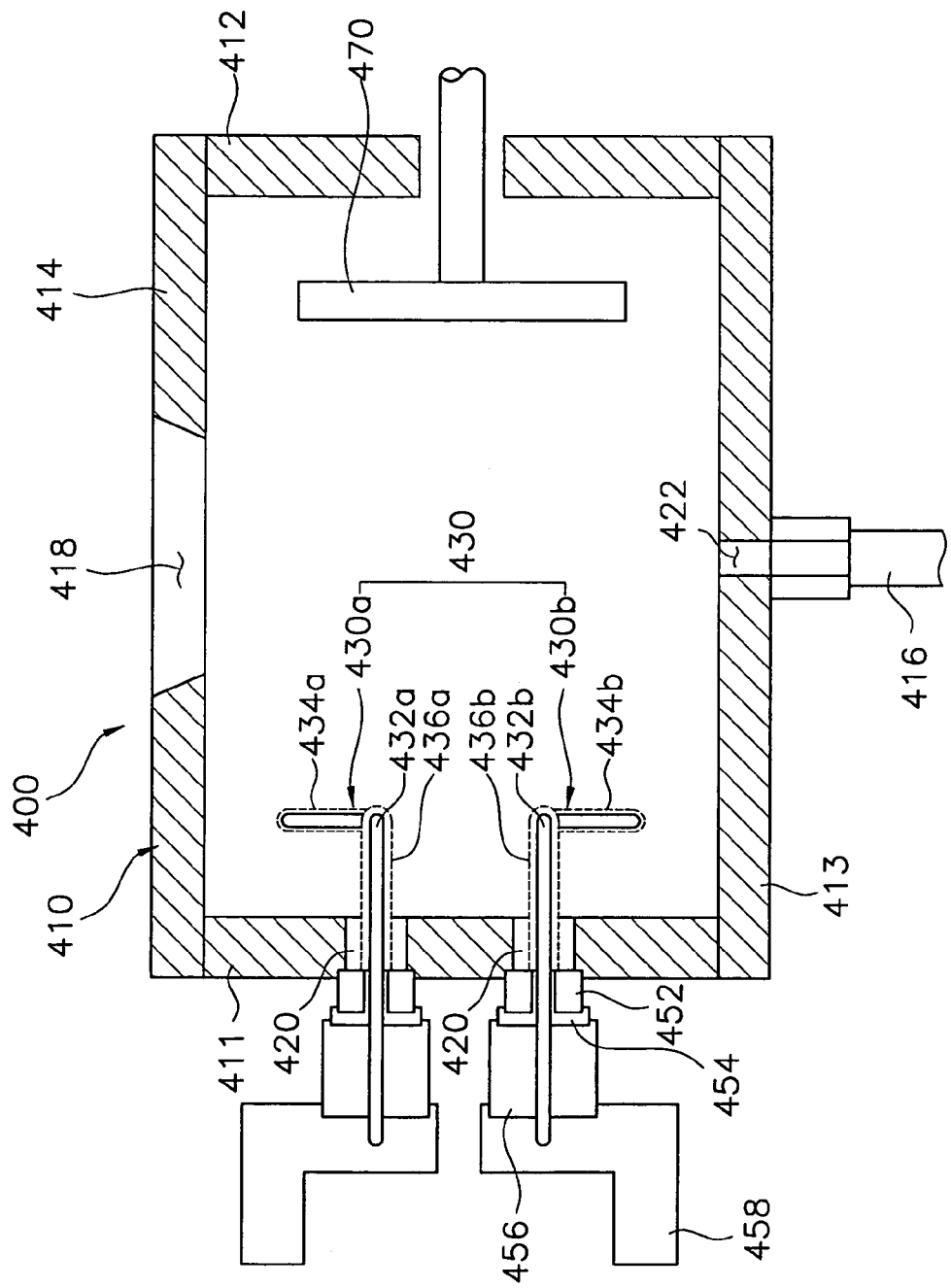
FIG. 6 is a cross sectional view illustrating an ion source in accordance with another embodiment of the present invention.
Figure 7:
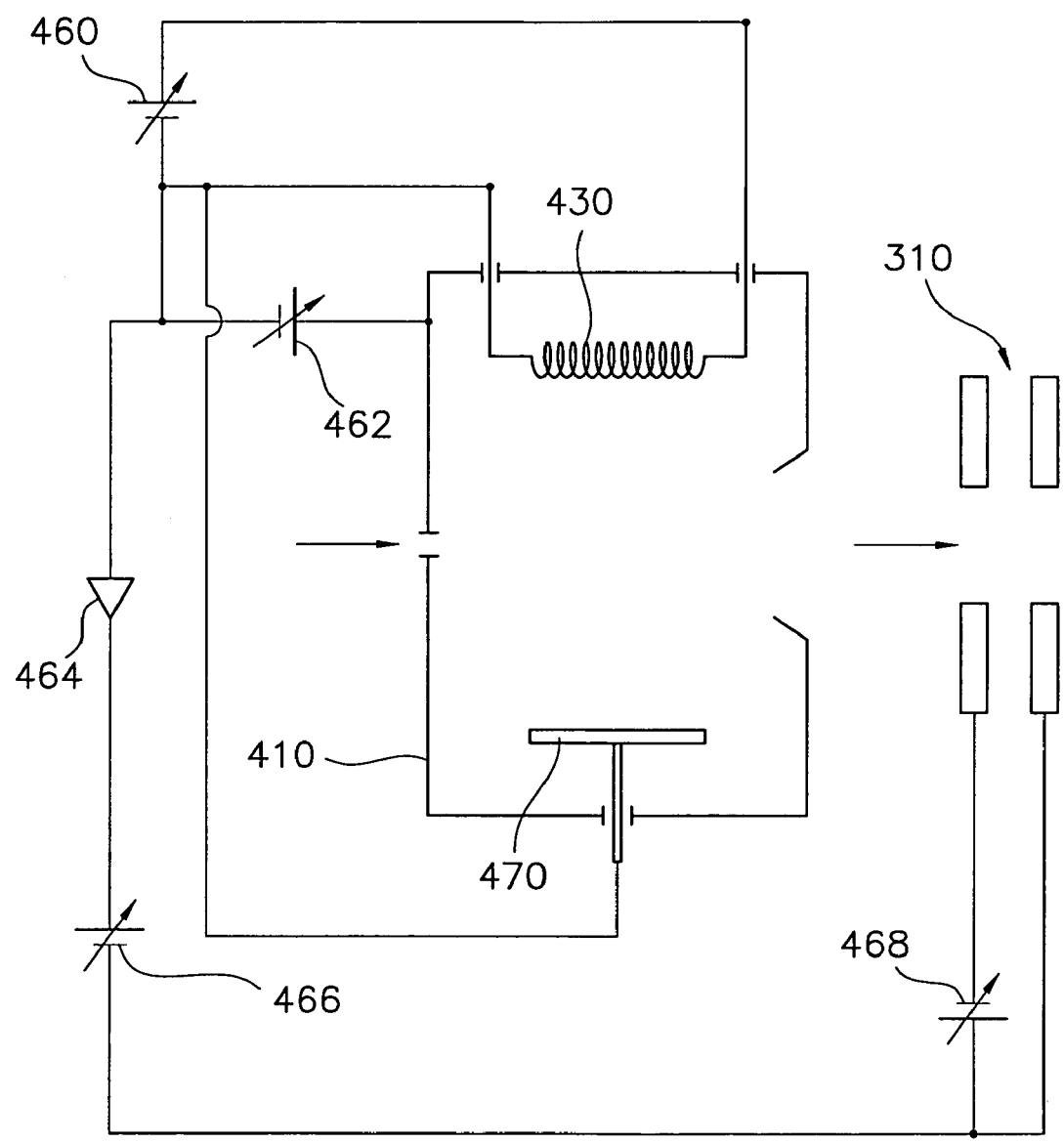
FIG. 7 is an electrical circuit diagram illustrating a circuit connected to the ion source in FIG. 6.

Referring to FIGS. 6 and 7, an ion source 400 includes an arc chamber 410 that defines a space for generating the ions. First and second filaments 430a and 430b emit electrons into the arc chamber 410.

The arc chamber 410 includes a plurality of the walls, an upper panel, and a lower panel. Holes 420 are formed through a first wall 411, and the first and second filaments 430a and 430b pass through the holes 420. A second wall 412 disposed opposite to the first wall 411 extends in parallel with the first wall 411. A hole 422, in communication with the source gas-supplying pipe 416 for providing the source gas, is formed through a third wall 413 that is disposed substantially perpendicular to the first wall 411 and the second wall 412. A hole 418 for extracting ions that are generated in the arc chamber 410 is formed through a fourth wall 414 disposed opposite to the third wall 413.

The first filament 430a includes a first filament rod 432a, extending from inside of the arc chamber 410 to outside of the arc chamber 410 through the first wall 411, a first coil 434a, and a pair of second coils 436a. The first filament rod 432a also includes an electron-emitting portion for thermoelectrically emitting electrons, a pair of leads extending from upper faces of insulation rings to outside of the arc chamber 410, and a pair of connection portions extending to the inside of the arc chamber 410 through the first wall 411. The connection portions are connected between the electron-emitting portion and the leads, respectively. A first coil 434a is wound around the electron-emitting portion. Second coils 436a are wound around the connection portions, respectively. The first coil 434a reduces deterioration of the electron-emitting portion. A diameter of the second coil 436a is greater than that of the first coil 434a so that electrical resistances of the connection portions are less than that of the electron-emitting portion.

The second filament 430b is disposed adjacent to the first filament 430a. The second filament 430b includes a second filament rod 432b, a third coil 434b, and fourth coils 436b. The electron-emitting portions of the first and second filament rods 432a and 432b are disposed in a circular area of the arc chamber 410. The first and second filament rods 432a and 432b extend to the outside of the arc chamber 410 through the holes 420 formed in the first wall 411. The holes 420 have inner diameters greater than outer diameters of the first and second filament rod 432a and 432b. The first and second filaments 430a and 430b are electrically insulated from the arc chamber 410 by the insulation rings 452.

Clamps 458 may be employed to lock the leads in position. Spacers 454 and sleeves 456 are interposed between the clamps 458 and the insulation rings 452.

Electrons emitted from the filaments 430 collide with molecules of the source gas that is provided from the source gas-supplying pipe 416 so that the ions are generated. The ions are converted into the ion beam by an ion extractor 310.

The electrons are removed from the arc chamber 410 by an arc voltage applied to the walls 411, 412, 413, and 414 of the arc chamber 410.

A reflector 470 for reflecting the electrons emitted from the filaments 430 is disposed opposite to the filaments 430. The reflector 470 extends from the outside of the arc chamber 410 to the inside of the arc chamber 410. The reflector 470 is connected to a cathode terminal of a filament power source 460. Alternatively, an electrically floating repeller may be disposed opposite to the filaments 430.

Although it is shown in the drawings, the ion source may include solenoids for generating a magnetic field to increase a collision rate between the emitted electrons and the molecules of the source gas. The solenoids prevent the electrons emitted from the filaments 430 from being directly collected by the walls 411, 412, 413, and 414 of the arc chamber 410 to which the arc voltage is applied. Thus, the ion generation rate may be increased.

A filament current is applied to the filaments 430 from which the electrons are thermoelectrically emitted into the arc chamber 410. The arc voltage biased with respect to the filament current is applied to the walls of the arc chamber 410. The leads of the filaments 430 are connected to an anode terminal of the filament power source 460 and the cathode terminal of the filament power source 460, respectively. A cathode of the arc power source 462 is connected to the cathode of the filament power source 460. The cathodes of the filament power source 460 and the arc power source 462 are connected to the ground 464.

The ion extractor 310 is connected to a cathode terminal of the extraction power source 466. A suppression power source 468 for reducing generation of radioactive rays is connected between the ion extractor 310 and the extraction power source 466.

Some elements in the ion source of the present embodiment are substantially identical to those illustrated with reference to FIGS. 2 to 5. Thus, illustrations of the identical elements are omitted.

Figure 8:
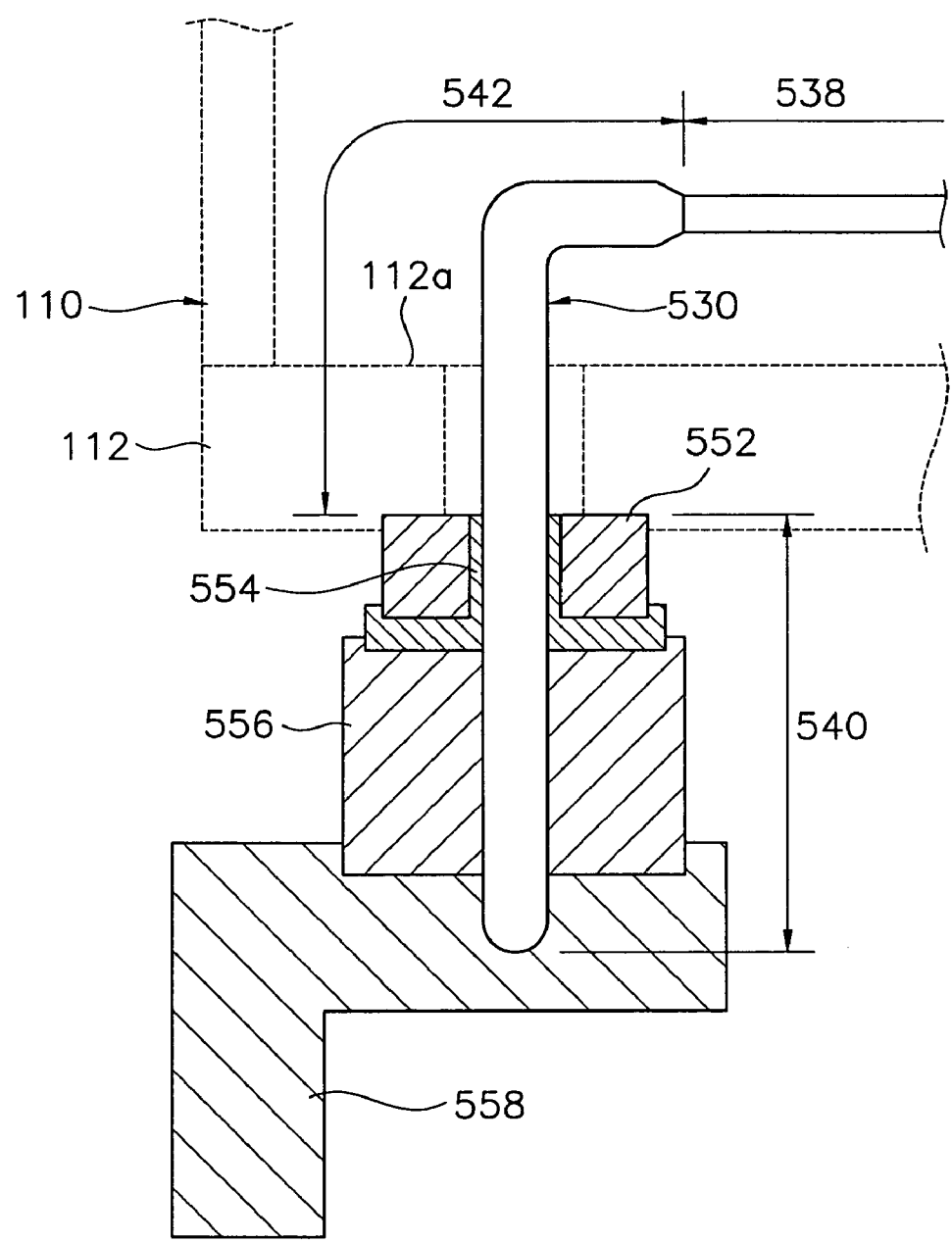
FIG. 8 is a cross sectional view illustrating a filament from which electrons are emitted in accordance with still another embodiment of the present invention.

Referring to FIG. 8, the filament 530 includes an electron-emitting portion 538 disposed in an arc chamber 110, a pair of leads 540 extending from a sidewall of the arc chamber 110, and a pair of connection portions 542 connected between the electron-emitting portion 538 and the leads 540.

The electron-emitting portion 538 has an arched shape. The electron-emitting portion 538 is disposed in parallel with the first wall 112 of the arc chamber 110. The leads 540 extend in a direction perpendicular to the first wall 112 of the arc chamber 110. The connection portions 542 extend to the inside of the arc chamber in a direction perpendicular to, and through, the first wall 112. The connection portions 542 then extend toward the electron-emitting portion 538 so that the connection portions 542 are connected to the electron-emitting portion 538 in a direction parallel with the first wall 112.

The electron-emitting portion 538 has a diameter less than that of the connection portions 542 and the leads 540. The connection portions 542 have the diameters substantially equal to those of the leads 540. Thus, an electrical resistance of the electron-emitting portion 538 is greater than those of the connection portions 542 and the leads 540. As a result, electrons are thermoelectrically emitted into the arc chamber 110 from the electron-emitting portion 538 rather than from the connection portions 542. In addition, thermal deterioration of the connection portions 542 may be decreased.

The filaments 530 are insulated from the first wall 112 of the arc chamber 110 by the insulation rings 552. The sleeves 554 and the spacers 556 encompass the filament 530. Clamps 558 lock the filament 530.

Figure 9:
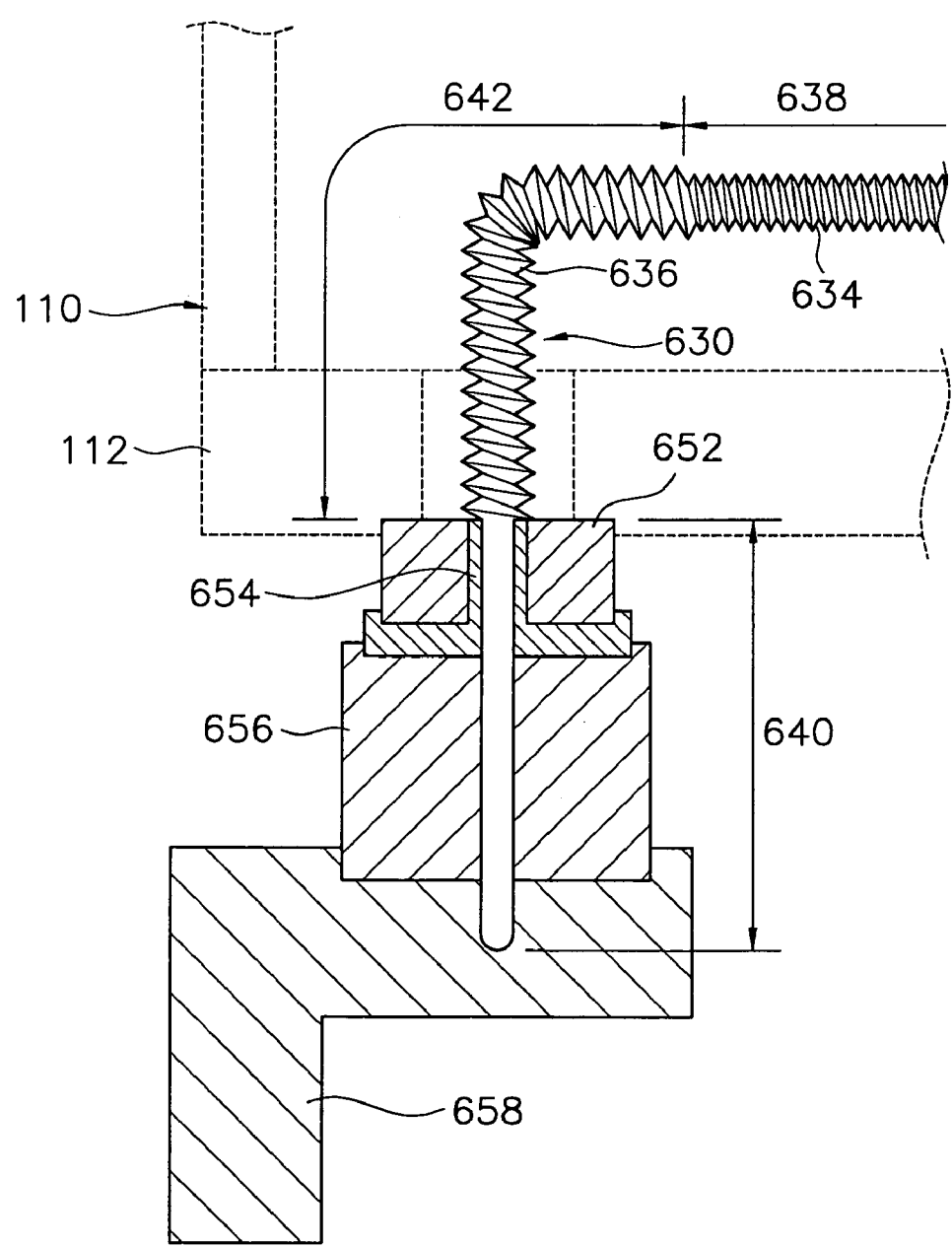
FIG. 9 is a cross sectional view illustrating a filament from which electrons are emitted in accordance with yet another embodiment of the present invention.

Referring to FIG. 9, a filament 630 includes an electron-emitting portion 638 disposed in an arc chamber 110, a pair of leads 640 extending from a sidewall of the arc chamber 110 to outside of the arc chamber 110, and a pair of connection portions 642 connected between the electron-emitting portion 638 and the leads 640.

First threads 634 are formed at a surface of the electron-emitting portion 638. Second threads 636 are formed at the surfaces of the connection portions 642. The first threads 634 have pitches less than those of the second threads 636.

The mean diameter of the connection portions 642 is preferably greater than that of the electron-emitting portion 638. Outer diameters of the connection portions are preferably greater than that of the electron-emitting portion 638. The outer diameters of the connection portions 642 are preferably not less than the outer diameters of the electron-emitting portion 638.

The second threads 636 decrease the electrical resistance of the connection portion 642 relatively compared to that of the electron-emitting portion 638. The first threads 634 increase active areas of the electron-emitting portion 638 to reduce the electron-emitting portion 638 from being deteriorated by thermal stress. As a result, the filament 630 may have a longer useful life.

In this embodiment of the present invention, the first and second threads 634 and 636 include a triangular thread. Alternatively, the first and second threads 634 and 636 may include a rectangular thread, a trapezoid thread, a semicircular thread, etc.

The filament 630 is insulated from the first wall 112 of the arc chamber 110 by the insulation rings 652. Sleeves 654 and spacers 656 encompass the filament 630. Clamps 658 lock the filament 630 in position.

Figure 10:
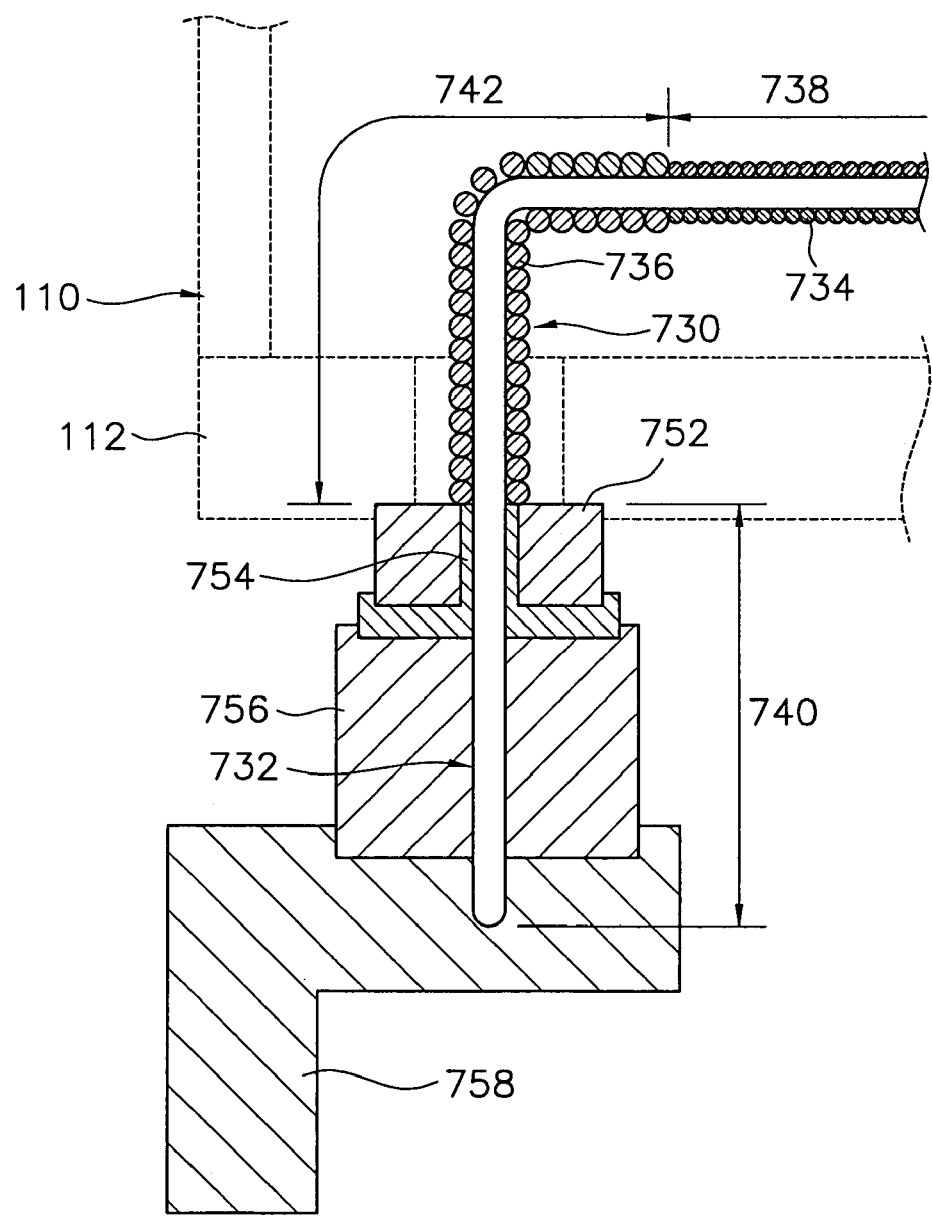
FIG. 10 is a cross sectional view illustrating a filament from which electrons are emitted in accordance with another embodiment of the present invention.

Some elements of the present embodiment are substantially identical to those of the first filament illustrated with reference to FIGS. 3 and 4. Thus, illustrations of the identical elements are omitted Referring to FIG. 10, a filament 730 extends from inside of an arc chamber 110 to outside of the arc chamber 110 through a first wall 112 of the arc chamber 110. The filament 730 includes a filament rod 732 having a constant diameter, and first and second rings 734 and 736 surrounding the filament rod 732.

The filament rod 732 is disposed in the arc chamber 110. The filament rod 732 includes an electron-emitting portion 738 for thermoelectrically emitting electrons, a pair of leads 740 extending from a sidewall of the arc chamber 110 to the outside of the arc chamber 110, and a pair of connection portions 742 extending to the inside of the arced camber 110 through the first wall 112 and connected between the electron-emitting portion 738 and the leads 740.

The first rings 734 have cross sectional areas less than those of the second rings 736. The first rings 734 have outer diameters less than the outer diameters of the second rings 736. The first rings 734 have inner diameters substantially equal to those of the second rings 736. The first rings 734 encompass the electron-emitting portion 738. The first rings 734 are in close contact with the outer surface of the electron-emitting portion 738. The first rings 734 are in close contact with each other. The second rings 736 surround the connection portions 742. The second rings 736 make contact with the outer surface of the connection portions 742. The second rings 736 also make contact with each other. Preferably, the first and second rings 734 and 736 make contact with the filament rod 732 that is inserted into the first and second rings 734 and 736. Preferably, the first and second rings 734 and 736 make contact with each other.

The second rings 736 lower the electrical resistances of the connection portions 742 so that it is less than that of the electron-emitting portion 738. Thus, the electrons are thermoelectrically emitted into the arc chamber 110 from the electron-emitting portion 738 rather than the connection portions 742. The first rings 736 increase the active areas of the electron-emitting portion from which electrons are emitted. As a result, the electron emission rate may be increased. In addition, the first rings 734 reduces deterioration of the electron-emitting portion 738. Therefore, the filament 730 may have a longer useful life.

In this embodiment of the present invention, the cross-sectional shapes of the first and second rings 734 and 736 are circular. Alternatively, many variations of the cross-sectional shapes are possible without departing from the spirit or scope of the invention.

Figure 11:
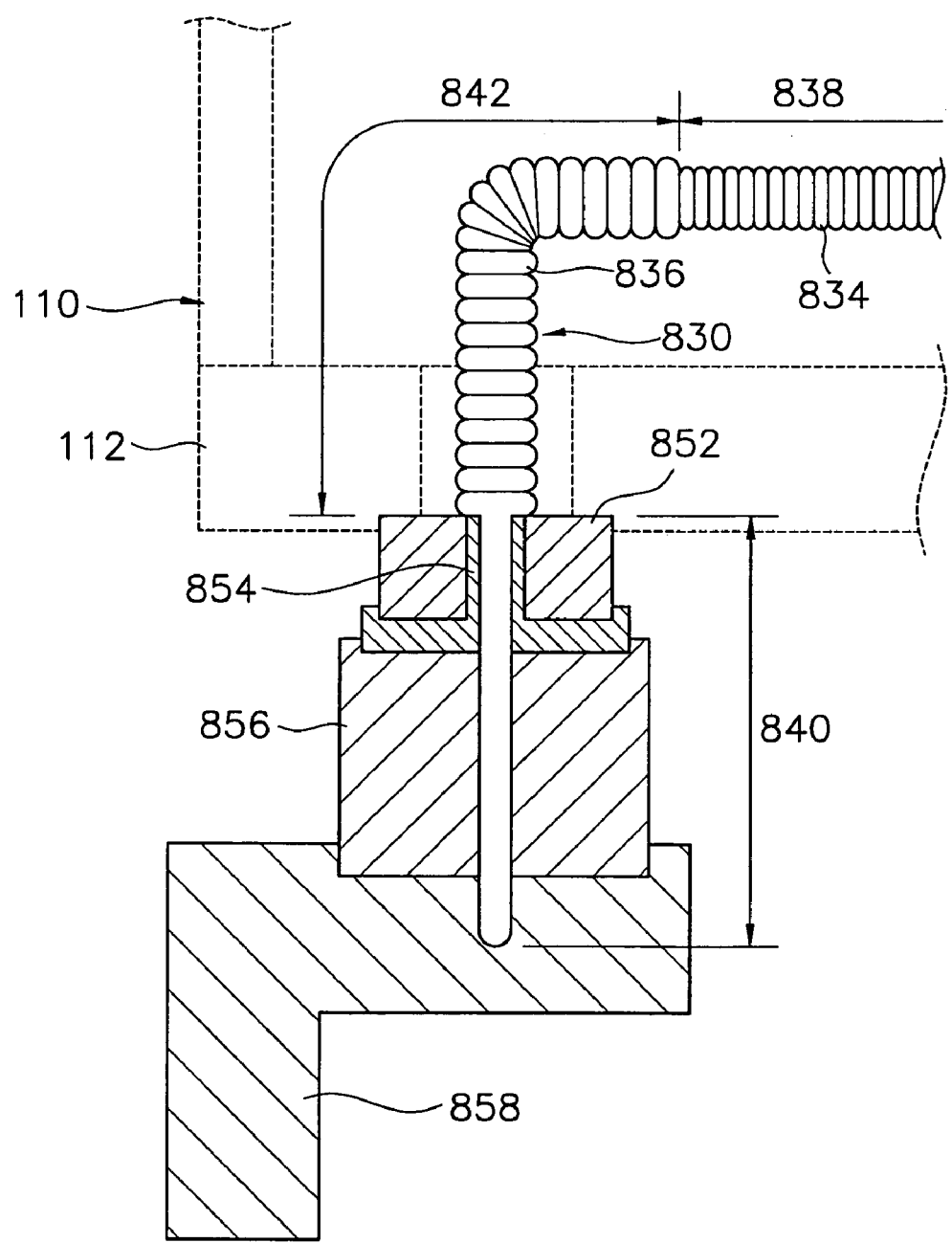
FIG. 11 is a cross sectional view illustrating a filament from which electrons are emitted in accordance with another embodiment of the present invention.

Reference numerals 752, 754, 756, and 758 indicate the insulation ring, the sleeve, the spacer and the clamp, respectively. Above-described elements of the present embodiment are substantially identical to those of the first filament illustrated with reference to FIGS. 3 and 4. Thus, illustrations of the identical elements are omitted Referring to FIG. 11, a filament 830 includes an electron-emitting portion 838 disposed in an arc chamber 110, a pair of leads extending from a sidewall of the arc chamber 110 to outside of the arc chamber 110, and a pair of connection portion 842 extending into the arc chamber 110 through the first wall 112 of the arc chamber 110 and connected between the electron-emitting portion 838 and the leads 840.

A plurality of first annular protrusions 834 is sequentially formed at the surface portion of the electron-emitting portion 838. A plurality of second annular protrusions 836 are sequentially formed at a surface portion of the connection portions 836.

The first annular protrusions 834 have cross sectional areas preferably greater than those of the second annular protrusions 836. The electron-emitting portion 838 has a diameter less than those of the connection portions 842. In this embodiment of the present invention, although the cross-sectional shapes of the first and second annular protrusions 834 and 836 are a semi-circular, other variations of the cross-sectional shapes are possible without departing from the spirit or scope of the invention.

The second annular protrusions 836 lower electrical resistances of the connection portions to be less than that of the electron-emitting portion 838. The first annular protrusions 838 increase active areas of the electron-emitting portion 838 from which electrons are emitted. The first annular protrusions 834 also protects the electron-emitting portion 838 from being deteriorated by thermal stress. As a result, the filament 838 may have a longer useful life.

Reference numerals 852, 854, 856, and 858 indicate the insulation ring, a sleeve, spacer, and a clamp, respectively.

Above-described elements of the present embodiment are substantially identical to those of the first filament illustrated with reference to FIGS. 3 and 4. Thus, illustrations of the identical elements are omitted.

According to the present invention, the ion source includes an arc chamber for providing a space in which ions are generated, and at least one filament for emitting electrons into the arc chamber. A first coil is wound around the electron-emitting portion. The first coil reduces deterioration of the electron-emitting portion by thermal stress. The first coil also increase active areas from which electrons are emitted. A second coil is wound around the connection portions. The second coils lower electrical resistances of the connection portions to be less than that of the electron emission portion.

Thus, the electrons are thermoelectrically emitted into the arc chamber from the electron emission portion rather than the connection portions. An electron emission rate may also be increased. In addition, since the filament has longer useful life, downtime of an ion implanter including the ion source may be decreased.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. An ion source comprising:
an arc chamber; and
a filament for emitting electrons into the arc chamber, wherein the filament comprises:
an electron-emitting portion disposed in the arc chamber for emitting the electrons into the arc chamber, the electron-emitting portion having an irregular outer surface, wherein a width of the irregular outer surface varies from a first width to a second width a plurality of times from a first end of the electron-emitting portion to a second end of the electro-emitting portion; and
a pair of connection portions extending into the arc chamber through the sidewall, the electron-emitting portion being disposed between said pair of connection portions, the connection portions having electrical resistances less than that of the electron-emitting portion.

2. The ion source of claim 1, wherein the irregular outer surface comprises a first coil wound around the electron-emitting portion.

3. The ion source of claim 2, further comprising a second coil wound around the connection portions.

4. The ion source of claim 3, wherein the electron-emitting portion has a diameter that is substantially equal to the diameter of the second coil.

5. The ion source of claim 3, wherein the first coil has a diameter that is less than the diameter of the second coil.

6. The ion source of claim 3, wherein the electron-emitting portion has a mean diameter that is less than the diameter of the second coil.

7. The ion source of claim 1, the irregular outer surface comprises a plurality of threads.

8. The ion source of claim 1, wherein the connection portions comprise an irregular outer surface.

9. The ion source of claim 1, wherein the electron-emitting portion has a mean diameter that is less than the mean diameter of the connection portions.

10. The ion source of claim 1, wherein the irregular outer surface comprises a plurality of rings surrounding the electron-emitting portion.

11. The ion source of claim 1, further comprising a plurality of rings surrounding the connection portions.

12. The ion source of claim 1, wherein the electron-emitting portion has a diameter which is substantially equal to the diameter of the connection portions.

13. The ion source of claim 1, which further includes a plurality of rings surrounding the electron-emitting portion having a mean diameter that is less than a plurality of rings surrounding the connection portions.

14. The ion source of claim 1, wherein the irregular outer surface comprises a plurality of annular protrusions.

15. The ion source of claim 1, wherein a plurality of annular protrusions are formed on the connection portions.

16. The ion source of claim 15, wherein the mean diameter of the electron-emitting portion is less than the mean diameter of the connection portions.

17. The ion source of claim 1, further comprising a pair of leads extending from a sidewall of the arc chamber to an outside of the arc chamber and connected to a filament power source.

18. An ion source comprising:
an arc chamber; and
a filament for emitting electrons into the arc chamber, wherein the filament comprises:
an electron-emitting portion disposed in the arc chamber for emitting the electrons into the arc chamber; and
a pair of connection portions extending within the arc chamber through the sidewall, the electron-emitting portion being disposed between the pair of connection portions, the connection portions having electrical resistances less than that of the electron-emitting portion, the connection portions having an irregular outer surface.

19. The ion source of claim 18, wherein the irregular outer surface comprises a coil wound around the connection portions.

20. The ion source of claim 18, wherein the irregular outer surface comprises a thread formed on the connection portions.

21. The ion source of claim 18, wherein the irregular outer surface comprises a plurality of rings surrounding the connection portions.

22. The ion source of claim 18, wherein the irregular outer surface comprises a plurality of annular protrusions.

23. The ion source of claim 18, further comprising a pair of leads extending from a sidewall of the arc chamber to an outside of the arc chamber, the leads being connected to a filament power source.

24. An ion implanter comprising:
an ion source comprising an arc chamber and a filament for emitting electrons into the arc chamber;
an end station unit for handling a semiconductor substrate for implanting ions provided from the ion source into the semiconductor substrate; and
a transportation unit connected between the ion source and the ending station unit for transmitting the ions to the ending station unit,
wherein the filament comprises:
an electron-emitting portion disposed in the arc chamber for emitting the electrons into the arc chamber, the electron-emitting portion having an irregular outer surface, wherein a width of the irregular outer surface varies from a first width to a second width a plurality of times from a first end of the electron-emitting portion to a second end of the electro-emitting portion; and
a pair of connection portions extending into the arc chamber through the sidewall, the electron-emitting portion being disposed between said pair of connections portions, the connection portions having electrical resistances less than that of the electron-emitting portion.

25. The ion implanter of claim 24, further comprising a pair of leads extending from a sidewall of the arc chamber to an outside of the arc chamber and connected to a filament power source.

26. The ion implanter of claim 24, wherein the irregular outer surface comprises a coil wound disposed around the electron-emitting portion.

27. The ion implanter of claim 26, further comprising a second coil wound around the connection portions.

28. The ion implanter of claim 27, wherein the electron-emitting portion has a diameter that is substantially equal to the diameter of the connection portions.

29. The ion implanter of claim 28, wherein the first coil has a diameter that is less than the diameter of the second coil.

30. The ion implanter of claim 27, wherein the first coil has a mean diameter that is less than the mean diameter of the second coil.

31. The ion implanter of claim 24, wherein the irregular outer surface comprises a plurality of threads.

32. The ion implanter of claim 31, wherein the plurality of threads, are formed on substantially the entire outer surface of the connection portions.

33. The ion implanter of claim 32, wherein the electron-emitting portion has a mean diameter which is less than the mean diameter of the connection portions.

34. The ion implanter of claim 24, wherein the irregular outer surface comprises a plurality of rings surrounding the electron-emitting portion.

35. The ion implanter of claim 24, further comprising a plurality of rings surrounding the connection portions.

36. The ion implanter of claim 35, wherein the electron-emitting portion has a diameter that is substantially equal to the diameter of the rings.

37. The ion implanter of claim 35, wherein the mean diameter of the rings surrounding the electron-emitting portion is less than the mean diameter of the rings surrounding the connection portions.

38. The ion implanter of claim 24, wherein the irregular outer surface comprises a plurality of annular protrusions.

39. The ion implanter of claim 24, which further includes a plurality of annular protrusions is formed on the surface of the connection portions.

40. The ion implanter of claim 39, wherein the mean diameter of the electron-emitting portions is less than the mean diameter of the connection portions.

41. An ion implanter comprising:

an ion source comprising an arc chamber and a filament for emitting electrons into the arc chamber;

an end station unit handling a semiconductor substrate for implanting ions provided from the ion source into the semiconductor substrate; and a transportation unit connected between the ion source and the end station unit for transmitting the ions to the end station unit, wherein the filament comprises:

an electron-emitting portion disposed in the arc chamber for emitting the electrons into the arc chamber; and a pair of connection portions extending into the arc chamber, the electron-emitting portion being connected between the pair of connection portions, the connection portions having electrical resistances less than that of the electron-emitting portion, the connection portions having an irregular outer surface extending into the arc chamber.

42. The ion source of claim 41, wherein the irregular outer surface comprises a coil wound around the entire connection portions.

43. The ion source of claim 41, wherein the irregular outer surface comprises a plurality of threads formed on the connection portions.

44. The ion source of claim 41, wherein the irregular outer surface comprises a plurality of rings surrounding the connection portions.

45. The ion source of claim 41, wherein the irregular outer surface comprises a plurality of annular protrusions formed on the connection portions.

* * * * *